US006326875B1

United States Patent
Tuovinen

(10) Patent No.: US 6,326,875 B1
(45) Date of Patent: Dec. 4, 2001

(54) ARRANGEMENT FOR IMPLEMENTING A MAGNETIC CIRCUIT ON A CIRCUIT BOARD

(75) Inventor: Risto Tuovinen, Helsinki (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/594,355

(22) Filed: Jun. 14, 2000

Related U.S. Application Data

(63) Continuation of application No. PCT/FI98/00970, filed on Dec. 11, 1998.

(30) Foreign Application Priority Data

Dec. 16, 1997 (FI) .......................................... 974535

(51) Int. Cl.$^7$ .................................................. H01F 27/30
(52) U.S. Cl. ............................................ 336/197; 336/210
(58) Field of Search ................................. 336/200, 210, 336/196, 197

(56) References Cited

U.S. PATENT DOCUMENTS

| 4,704,592 | 11/1987 | Marth et al. . |
| 4,967,175 | * 10/1990 | Berg et al. .............................. 336/65 |
| 6,033,594 | * 3/2000 | Enokido et al. ................... 252/62.62 |

FOREIGN PATENT DOCUMENTS

| 3620762 A1 | 12/1987 | (DE) . |
| 3807892 A1 | 9/1989 | (DE) . |
| 0060933 | * 5/1977 | (JP) ......................................... 336/65 |
| 02-0298005 | * 12/1990 | (JP) ......................................... 336/65 |
| 5-55048 A | 3/1993 | (JP) . |
| 40-6112046 | * 4/1994 | (JP) ......................................... 336/65 |
| 06132146 A | 5/1994 | (JP) . |

OTHER PUBLICATIONS

International Search report for PCT/FI98/00970.

* cited by examiner

*Primary Examiner*—Anh Mai
(74) *Attorney, Agent, or Firm*—Altera Law Group, LLC

(57) ABSTRACT

The invention relates to an arrangement for implementing a planar magnetic circuit on a circuit board. The arrangement includes (a) printed circuit board (PCB), wherein a conductive wire pattern of an inductive circuit is formed as well as openings through the circuit board close to the conductive pattern, (b) two ferrite pieces, at least one of which can be fitted into the openings so that the pieces may be pressed against one another from opposite sides of the circuit board, and (c) a mechanical clamp which can be fitted around the ferrite pieces to lock them to each other, whereby the clamp extends around the ferrite pieces located on both sides of the circuit board. To eliminate gluing of ferrite pieces and to eliminate any relative movement between the ferrite pieces and the circuit board, the clamp is formed with spring-like protrusions which are fitted in relation to the openings in the circuit board so that they are pressed against the inner edges of the openings when the clamp is in its position around the ferrite pieces.

6 Claims, 3 Drawing Sheets

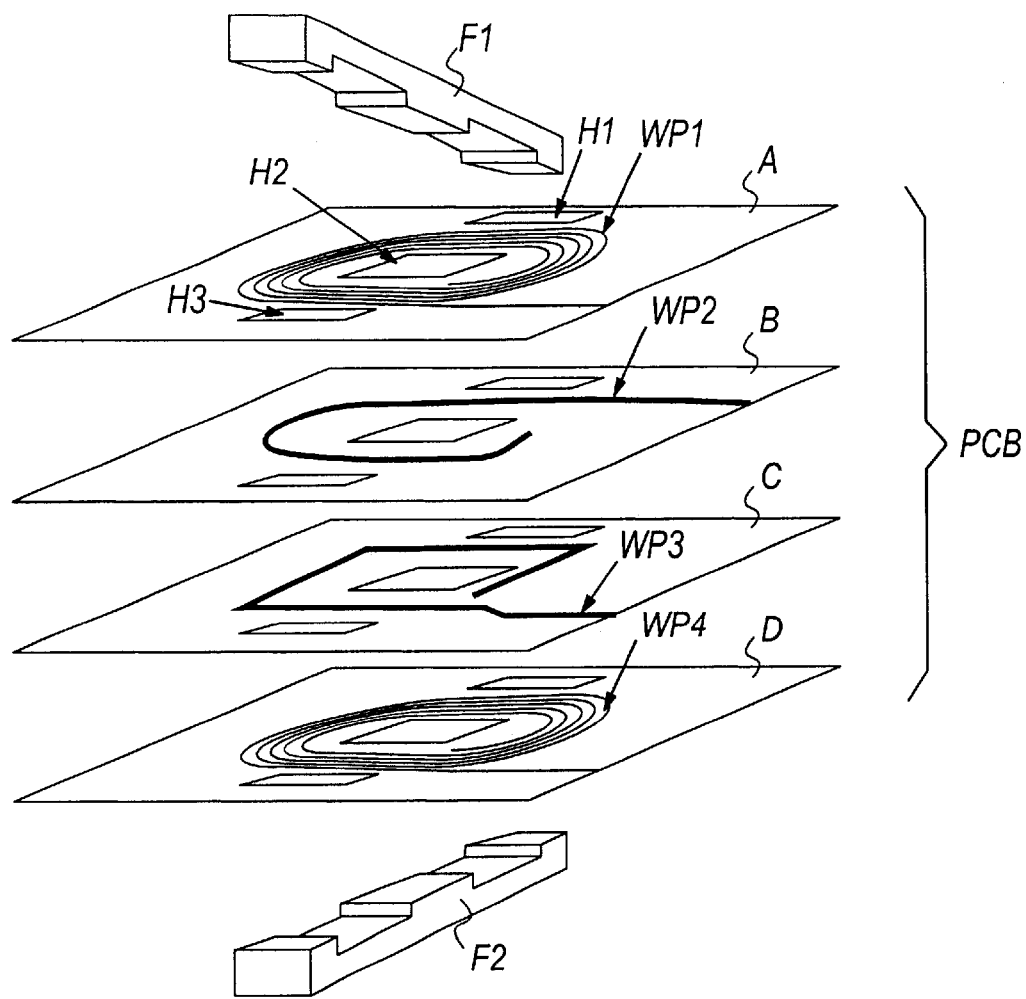
FIG. 1 - PRIOR ART
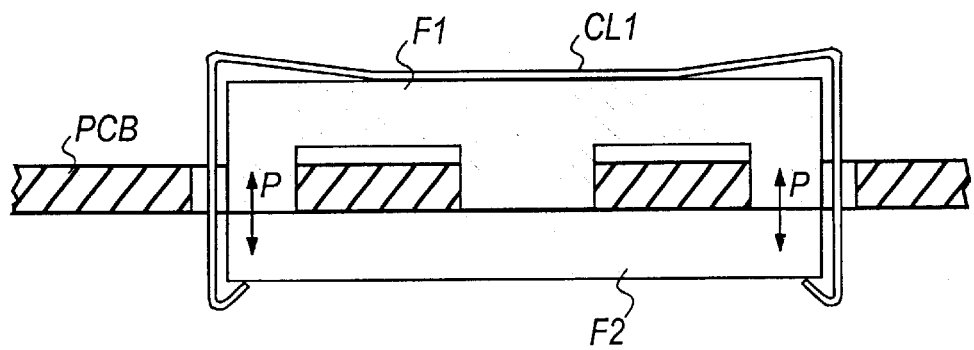
FIG. 2 - PRIOR ART

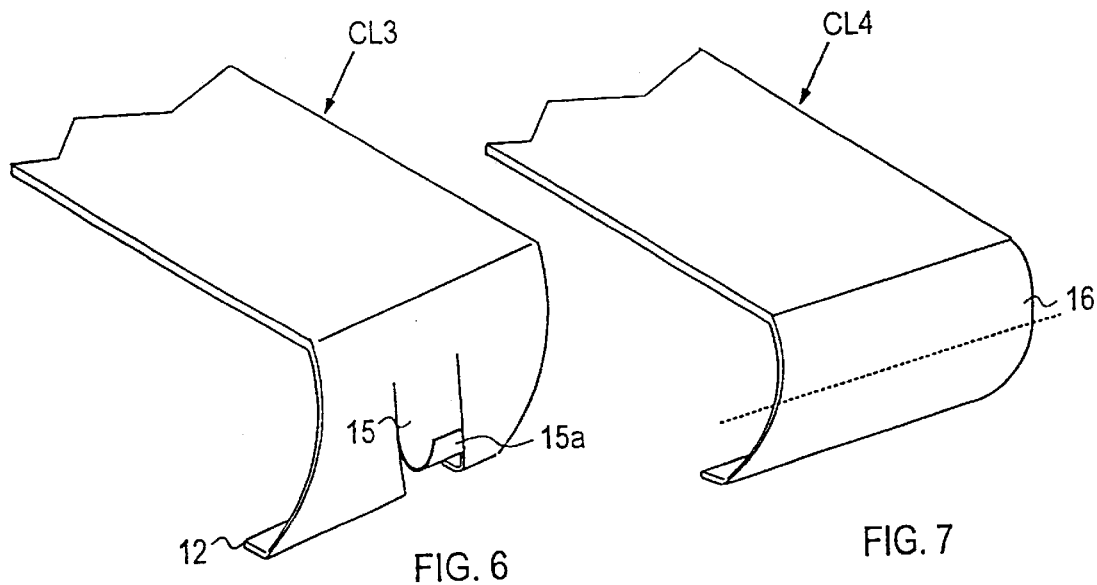
FIG. 6
FIG. 7
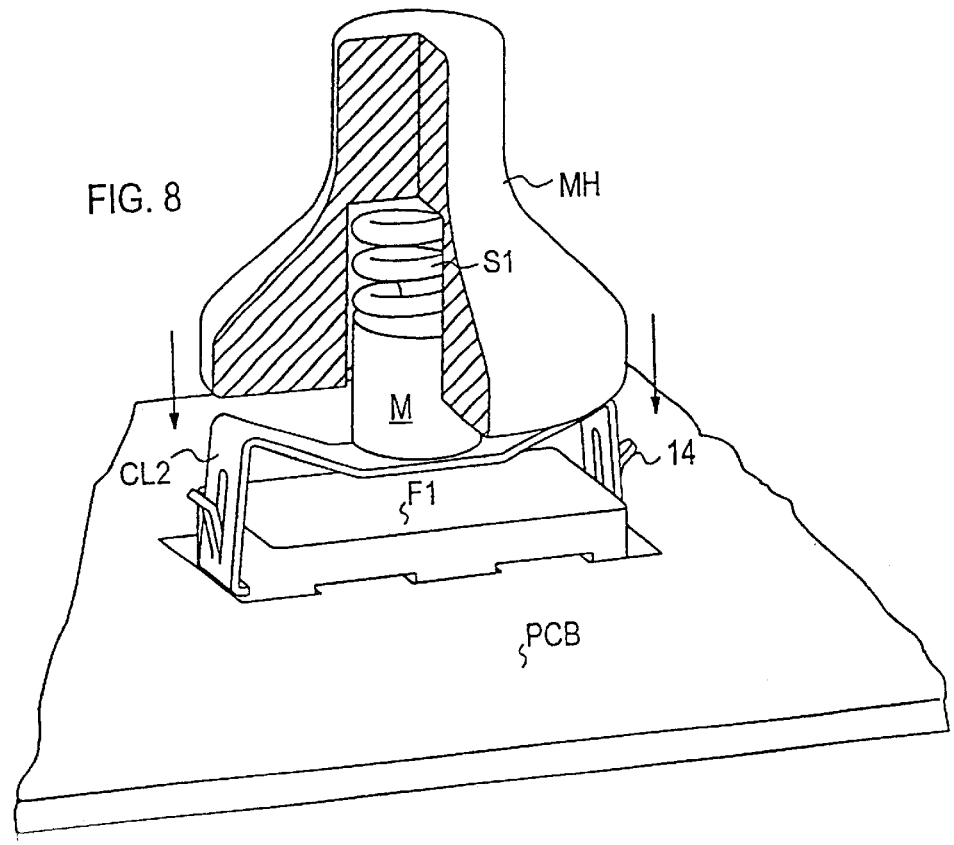
FIG. 8

ARRANGEMENT FOR IMPLEMENTING A MAGNETIC CIRCUIT ON A CIRCUIT BOARD

This application is a continuation of international application Ser. No. PCT/FI98/00970, filed Dec. 11, 1998.

FIELD OF THE INVENTION

This invention is generally related to inductive circuits implemented on a printed board, such as planar transformers, wherein ferrite pieces are used which are secured around a wire pattern formed on the circuit board. A route for the magnetic flux is brought about by these pieces. More specifically, the invention concerns attachment of such pieces to a circuit board.

BACKGROUND OF THE INVENTION

Planar magnetics is an advantageous alternative to the conventional iron cores, when a low profile is desired for inductive components. This alternative has been used generally, e.g. when implementing transformers on a circuit board.

In these so-called planar transformers, the transformer coils are integrated on the printed board. Such a structure is illustrated in FIG. 1, which shows four conductive layers A to D of a multiple layer circuit board PCB, whereby the desired winding pattern WP1 . . . WP4 is implemented for each layer. Together, these winding patterns form the transformer windings (primary and secondary windings). The transformer core in the case shown as an example in the figure is formed by E-profiled ferrite pieces F1 and F2, for which the circuit board has corresponding openings H1 . . . H3 extending through the board at the arms of the E. The ferrite pieces are pushed into the openings from opposite sides of the circuit board, whereby they will be placed opposite to one another at the openings so that the end surfaces of the E's arms are against each other.

Conventionally, the ferrite couple has been secured to the circuit board by gluing, so that one ferrite piece is first glued to the circuit board and then the ferrite pieces are glued together. However, gluing is a work step generally perceived as a health hazard, even despite the fact that efficient suction fans are used in the working space. Another drawback of gluing is that, once glued together, it is impossible later to remove the ferrite pieces without damaging the circuit board.

Another known method of securing ferrite pieces is to lock them to one another with the aid of a suitable mechanical locking body. Such a locking method is illustrated in FIG. 2, which is a cross-sectional view of ferrite pieces secured to one another and to a circuit board. The mechanical locking body CL1 attaching the ferrite pieces to each other is formed by a spring-like metal strip, which is pushed through the openings (H1, H3) in the circuit board so that it is located around the ferrite pieces. The metal strip functions as a spring pressing the ferrite pieces against each other (this pressing function of the spring is indicated by arrows P in the figure). In FIG. 2 only the upper ferrite piece F1 is E-profiled, whereas the lower piece F2 is slab-like.

By using only a mechanical locking body the drawbacks caused by gluing are avoided. However, attaching by using only a mechanical attaching body has the drawback that in certain operating environments the ferrite pieces can rub against the circuit board. This may have the result that the protective coating of the circuit board wears off and the ferrite piece contacts and damages the conductive pattern on the circuit board. Such an operating environment where vibration occurs can be e.g. in means of transportation, e.g. in trains or street-cars.

SUMMARY OF THE INVENTION

It is a purpose of the invention to eliminate the drawbacks mentioned above and to bring about an arrangement with which the above-mentioned gluing step can be entirely eliminated from the circuit board's manufacture step and with which, in addition, wear of the circuit board is avoided also in such operating environments where the circuit board is affected by vibration and can thus vibrate.

This aim is achieved through the solution defined in the independent claims.

The idea of the invention is to form such spring-like protrusions in the ends of the ferrite couple clamp, which are formed so in relation to openings in the circuit board that when the clamp is put in its place, they are pressed against the edges of openings in the circuit board, thereby locking the ferrite couple in position in relation to the circuit board.

The spring-like clamp according to the invention implements two functions: it holds the ferrite pieces locked to one another and at the same time it holds the ferrite couple locked in relation to the circuit board so that it can not move in relation to the circuit board, even if the circuit board is affected by vibration in its operating environment.

Since gluing is no longer needed, the ferrite pieces can be removed or exchanged without damaging the circuit board.

It is an additional advantage of the solution according to the invention that it is suitable for an automatic manufacturing process, because the clamp may be put in position mechanically in connection with the automatic assembling process of the other circuit board components.

BRIEF DESCRIPTION OF THE DRAWINGS

In the following the invention and its preferred embodiments are described in greater detail referring to the examples shown in FIGS. 3–8 of the appended drawings, wherein FIG. 1 illustrates a conventional method of implementing a planar transformer on a multilayer printed circuit board;

FIG. 2 shows a known method of attaching ferrite pieces to one another;

FIG. 6 illustrates an alternative embodiment of the clamp;

FIG. 7 illustrates another alternative embodiment of the clamp; and

FIG. 8 illustrates an automatic clamp assembling head.

DETAILED DESCRIPTION OF THE INVENTION

Figure 3:
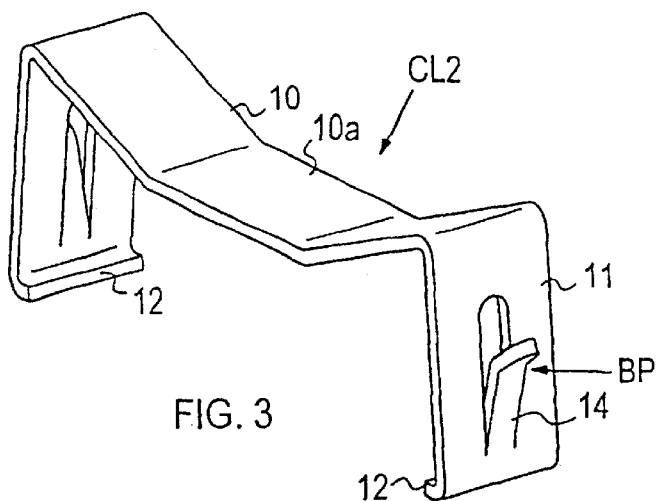
FIG. 3 illustrates a ferrite piece clamp in accordance with the invention.
Figure 4:
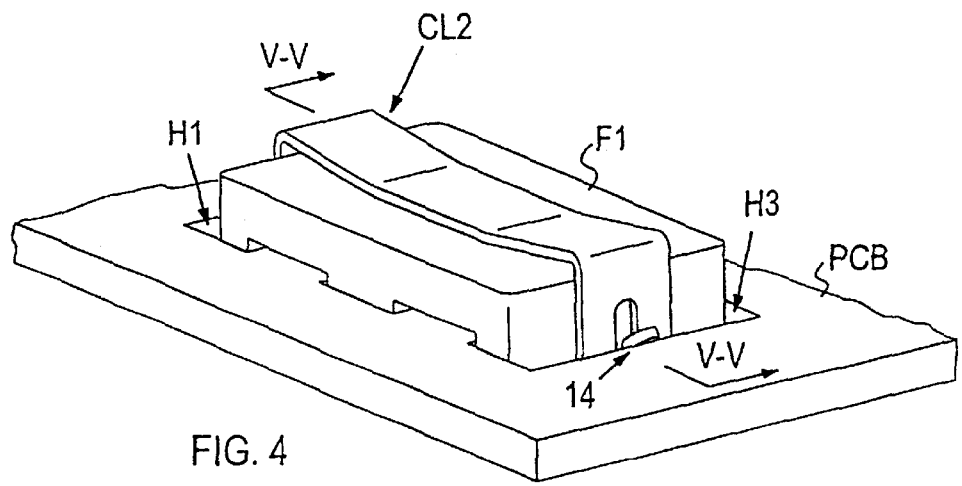
FIG. 4 is a perspective view of a circuit board, when the clamp of FIG. 3 is in its position around the ferrite pieces.
Figure 5:
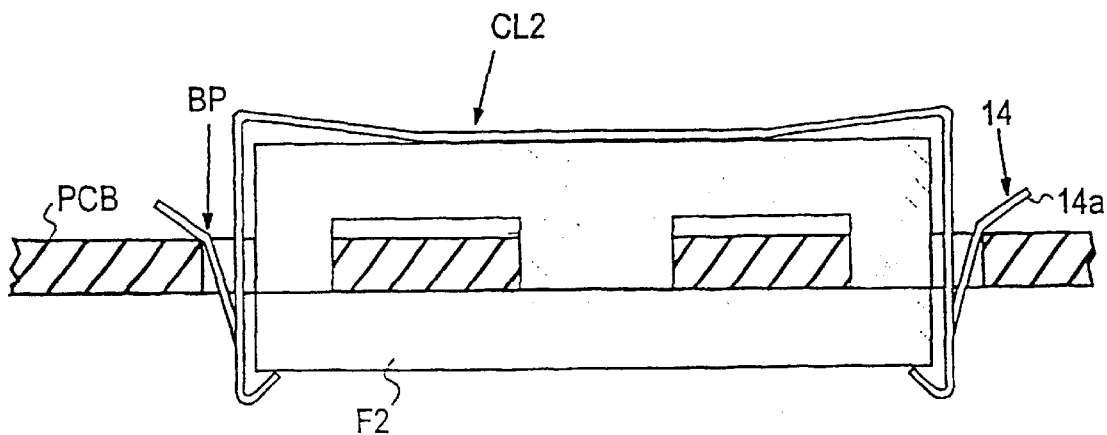
FIG. 5 is a cross-sectional view of the attachment according to FIG. 4 along line V—V in FIG. 4.

The solution according to the invention is first described by referring to FIGS. 3 . . . 5, wherein a first embodiment of the clamp according to the invention is used as an example. FIG. 3 is a perspective view of the clamp alone, while FIG. 4 is an illustrating perspective view of a circuit board, when the clamp of FIG. 4 is in its position around the ferrite pieces, and FIG. 5 is a cross-sectional view of the attachment according to FIG. 4.

As can be seen from FIG. 3, the clamp CL2 according to the invention is formed by a metal strip bent to shape and including a top part 10 coming above the topmost ferrite piece and end parts 11 bent downward therefrom, the free ends 12 of which are bent inwardly so that they are located below the lowest ferrite piece F2 (cf. FIG. 5). The top part is essentially in a horizontal direction at its middle part 10a, but from both sides of the middle part it is bent obliquely upwards, whereby thanks to the bends a spring effect is achieved, which will press the ferrite pieces against each other. Thus, with the structure described so far a similar pressing effect is achieved as with the known clamps.

To eliminate a relative movement of the ferrite pieces and the circuit board, tongue-like protrusions 14 are also formed in the end parts and they are integrated with the metal strip forming the clamp. In other words, the protrusions are formed from the material of the metal strip, e.g. by punching in the end parts perforations shaped like the protrusions. The tongue thus formed is bent outwards from the level of the end parts. The protrusions are bent at their lower part and, in addition, at a second bending point BP located close to the protrusion tip 14a, whereby the lower parts of the protrusions are thus at the level of the end parts and the protrusions extend obliquely outwards from the level of the end parts. Starting from the said second bending point, the protrusions are turned at an even sharper angle outwards from the level of the end parts. The protrusions function as springs which are pressed against the edges of openings in the circuit board, when the clamp is placed in its position around the ferrite pieces (cf. FIGS. 4 and 5). In this manner, the protrusions will lock the ferrite pieces in relation to the circuit board so that the ferrite pieces are not able to move in relation to the circuit board.

In this first embodiment, the protrusions and the circuit board openings are formed so in relation to each other that the protrusions are placed at bending points BP against the upper edges of the openings in the circuit board (FIG. 5), whereby the tip 14a of the protrusions remains above the circuit board (FIG. 4), thus allowing an easy removal of the clamp.

It is easy to manufacture the protrusions in the metal strip using metal sheet tools known as such, e.g. a bayonet for punching in the strip a tongue forming the protrusion. The finished protrusion is obtained with one stroke of the tool. In other words, the bends in the protrusion need not be made separately.

In the first embodiment shown in FIGS. 3 . . . 5, movement of the ferrite pieces is, prevented by tongue-like springs 14. These tongue-like springs may also be protrusions 15 like the ones shown e.g. in FIG. 6. In this case, the protrusions are formed by making perforations in the metal strip forming the clamp, starting from the free end 12 of the end parts, and by bending the tongues into protrusions essentially shaped like the letter U and having an outer side pressing against the edge of the circuit board openings and with a free tip 15a extending above the circuit board.

The function implemented with protrusions can also be achieved e.g. with a structure like the one shown in FIG. 7 which has no separate protrusions at all. In this case, the end parts 16 of the clamp are rounded off so that their outer spot shown by a dashed line is pressed against the circuit board. A structure like this is more rigid, for which reason it is also more difficult to remove the said clamp from the circuit board.

The clamp according to the invention may be manufactured e.g. of stainless steel sheet which has a thickness in a range of 0.1 . . . 0.5 mm and spring hard $R_m$ preferably in a range of $R_m=1250 . . . 1500$ N/mm$^2$.

As was noted earlier, it is also an advantage of the clamp according to the invention that R may be attached around the ferrite pieces in connection with the automatic manufacturing process of the circuit board. FIG. 8 illustrates a possible automatic assembling head for attaching the clamp in its position. The clamp (CL2) hangs e.g. held by a magnet M at the assembling head MH and the magnet is mounted to the assembling head using a spring S1. The assembling head pushes the clamp downwards. When the magnet meets the ferrite piece, the magnet thanks to the spring is allowed to go into the assembling head, whereby it will not load the ferrite pieces as the assembling head presses the clamp in place.

Although the invention was described above with reference to the examples shown in the appended drawings, it is obvious that the invention is not limited to these, but it may be changed in many ways within the know-how of professionals in the field. Thus, e.g. the shape of spring-like protrusions may vary in many different ways, and there may be more than one protrusion at the clamp end. The principle according to the invention may also be applied to any other pieces which are mounted to the circuit board in the same way as ferrite pieces.

What is claimed is:

1. Arrangement for implementing a magnetic circuit on a circuit board, which arrangement includes a printed circuit board (PCB) wherein a conductive pattern of an inductive circuit is formed as well as openings (H1–H3) through the circuit board close to the conductive pattern, two ferrite pieces (F1, F2), at least one of which can be fitted into the openings so that the pieces can be pressed against one another from opposite sides of the circuit board, and a mechanical clamp (CL2, CL3, CL4) which can be fitted around the ferrite pieces to lock them to each other, whereby the clamp extends around ferrite pieces located on both sides of the circuit board, characterized in that spring-like protrusions (14–16) are formed in the clamp and they are fitted in relation to the openings (H1–H3) in the circuit board so that they press against the inner edges of the openings when the clamp is in its position around the ferrite pieces.

2. Arrangement as defined in claim 1, characterized in that the spring-like protrusions are formed by tongues (14, 15) which are bent outwards from the clamp surface.

3. Arrangement as defined in claim 2, characterized in that the tip (14a, 15a) of the tongues is positioned above the upper surface of the circuit board.

4. Arrangement as defined in claim 3, characterized in that the tongues are bent at least at their lower part, whereby the tongue's protrusion from the clamp surface grows towards the free end of the tongue.

5. Arrangement as defined in claim 4, characterized in that the free end of the tongue has an additional bend (BP) so that at the bend the tongue is positioned against the upper edges of the openings.

6. Arrangement as defined in claim 1, characterized in that the spring-like protrusions (16) are formed by end parts of the clamp, which are rounded off in such a way that their outer part is pressed against the edges of the openings in the circuit board.

* * * * *